(12) United States Patent
Kuebel et al.

(10) Patent No.: US 10,010,004 B2
(45) Date of Patent: Jun. 26, 2018

(54) ELECTRICAL MODULE CONTAINING AN ELECTRICAL COMPONENT AND A CONVERTER CONTAINING THE ELECTRICAL MODULE

(71) Applicant: SIEMENS AKTIENGESELLSCHAFT, Munich (DE)

(72) Inventors: Thomas Kuebel, Erlangen (DE); Daniel Schmitt, Postbauer-Heng (DE)

(73) Assignee: Siemens Aktiengesellschaft, Munich (DE)

( * ) Notice: Subject to any disclaimer, the term of this patent is extended or adjusted under 35 U.S.C. 154(b) by 0 days. days.

(21) Appl. No.: 15/437,986

(22) Filed: Feb. 21, 2017

(65) Prior Publication Data

US 2017/0245384 A1    Aug. 24, 2017

(30) Foreign Application Priority Data

Feb. 19, 2016  (DE) ........................ 10 2016 202 600

(51) Int. Cl.
*H05K 5/02* (2006.01)
*H05K 7/20* (2006.01)
*H05K 5/00* (2006.01)

(52) U.S. Cl.
CPC ......... *H05K 5/0256* (2013.01); *H05K 5/0004* (2013.01); *H05K 7/209* (2013.01)

(58) Field of Classification Search
CPC ..... H05K 5/0004; H05K 5/0256; H05K 7/209

USPC ......................................................... 361/707
See application file for complete search history.

(56) References Cited

U.S. PATENT DOCUMENTS

| | | | | |
|---|---|---|---|---|
| 5,315,153 | A * | 5/1994 | Nagai | H01L 23/057 257/701 |
| 5,606,200 | A * | 2/1997 | Haraguchi | H01L 23/04 257/687 |
| 7,417,198 | B2 * | 8/2008 | Betz | H01L 23/047 174/536 |
| 8,125,781 | B2 * | 2/2012 | Mamitsu | H01L 23/473 361/702 |
| 8,981,545 | B2 | 3/2015 | Hohlfeld et al. | |
| 9,318,979 | B2 | 4/2016 | Fischer et al. | |
| 2007/0134951 | A1 * | 6/2007 | Inagaki | H05K 3/284 439/74 |
| 2010/0265744 | A1 | 10/2010 | Dorn et al. | |
| 2014/0035117 | A1 | 2/2014 | Hohlfeld et al. | |

FOREIGN PATENT DOCUMENTS

| | | |
|---|---|---|
| DE | 3215632 A1 | 11/1983 |
| DE | 10225333 A1 | 8/2003 |
| DE | 102012211446 A1 | 1/2014 |

(Continued)

*Primary Examiner* — Mukund G Patel
(74) *Attorney, Agent, or Firm* — Laurence Greenberg; Werner Stemer; Ralph Locher (57) ABSTRACT

An electrical module contains at least one electrical component which is accommodated in a module housing. The module housing has at least two housing parts which lie one on the other and, on their own or together with one or more further housing parts of the module housing, delimit the interior of the module housing. There is at least one adhesive layer between the two housing parts, the adhesive layer adhesively bonding the two housing parts to one another.

16 Claims, 5 Drawing Sheets

(56) References Cited

FOREIGN PATENT DOCUMENTS

| | | |
|---|---|---|
| DE | 102014104856 A1 | 10/2015 |
| WO | 2009062534 A1 | 5/2009 |
| WO | 2012156261 A2 | 11/2012 |

\* cited by examiner

ELECTRICAL MODULE CONTAINING AN ELECTRICAL COMPONENT AND A CONVERTER CONTAINING THE ELECTRICAL MODULE

CROSS-REFERENCE TO RELATED APPLICATION

This application claims the priority, under 35 U.S.C. § 119, of German application DE 10 2016 202 600.3, filed Feb. 19, 2016; the prior application is herewith incorporated by reference in its entirety.

BACKGROUND OF THE INVENTION

Field of the Invention

The invention relates to electrical modules which are each equipped with at least one electrical component which is accommodated in a module housing.

Electrical modules of this kind are used, for example, in electrical converters, in particular multilevel converters, in which a large number of electrical modules of the described kind are arranged very closely next to one another. In converters of this kind, the modules are often connected electrically in series so as to form module series circuits.

International patent disclosure WO 2012/156261 A2, corresponding to U.S. Pat. No. 9,318,979, describes an exemplary embodiment of a multilevel converter in which electrical modules, as are described below, can be used.

Particularly in the field of energy transmission technology, the electrical modules described are loaded with very high electric currents, so that, in the event of failure of a component or in the event of a fault, the electrical component or components which are located in the module housing can be explosively destroyed owing to the converted electrical power. If explosive gas (for example metallic/carbon-containing dust, splinters etc.) escapes from the module housing, adjacent electrical modules, which previously continued to operate electrically without problems, can be damaged or destroyed by the explosive gas since, as a result, the air gap is undershot owing to the impurities, and therefore a chain reaction can occur, the chain reaction destroying a large number of adjacent electrical modules. In the case of the converters described above, this can have dramatic consequences—in particular in the high-voltage range.

SUMMARY OF THE INVENTION

The object of the invention is to specify an electrical module which can be produced in a simple and cost-effective manner and, in the event of a fault or an explosion in the interior of the module housing, prevents gas from flowing to the outside or prevents explosive gases escaping to the outside, but at least inhibits this better than before.

According to the invention, this object is achieved by an electrical module containing the features as claimed in the main patent claim. Advantageous refinements of the module according to the invention are specified in the dependent claims.

Accordingly, the invention provides that the module housing has at least two housing parts which lie one on the other and, on their own or together with one or more further housing parts of the module housing, delimit the interior of the module housing, and there is at least one adhesive layer between the two housing parts, the adhesive layer adhesively bonding the two housing parts to one another.

A significant advantage of the module according to the invention is that simple and cost-effective assembly and production of the module are possible owing to the adhesive bonding of housing parts of the module housing as is provided according to the invention. In the process, a holding force which is so great that the module housing is held together even in the event of an explosion in the housing interior and the risk to adjacent modules as described in the introductory part is avoided can surprisingly be achieved between the adhesively bonded housing parts.

With a view to a particularly good sealing action, it is considered to be advantageous when the adhesive layer forms a laminated ring which runs around the interior of the module housing in an annular manner.

At least one of the two housing parts preferably has at least one recess, the inner wall of the recess being covered by the adhesive layer.

The other of the two housing parts preferably has a protrusion which engages into the recess. The inner wall of the recess and the protrusion are preferably adhesively bonded to one another by the adhesive layer.

It is particularly advantageous when the adhesive layer has at least one layer section which, in cross section, is u-shaped or is u-shaped at least in sections and has two side walls and a base wall which connects the two side walls, each of the two side walls in each case forms an adhesive section which is arranged at an angle to the support plane in which the two housing parts lie one on the other, and the base wall of the layer section lies on a base of a recess, which base is parallel to the support plane in particular, in one of the two housing parts, in particular on a groove base in the case of a groove-like recess.

With a view to annular sealing off, it is considered to be advantageous when the recess is annular and runs around the outside of the interior of the module housing in an annular manner, the protrusion, which engages into the recess, of the other housing part likewise runs around the outside of the interior of the module housing in an annular manner and engages as an annular protrusion into the annular recess, and a layer section of the adhesive layer, which layer section lies between the inner wall of the recess and the engaging protrusion, forms an annular sealing ring which seals off the interior of the module housing in an annular manner.

In respect of routing electrical contacts to the outside, it is considered to be advantageous when the recess is semi-annular or, owing to electrical contacts which are routed to the outside, only approximately semi-annular and runs around the outside of half of the interior of the module housing or virtually half, the protrusion, which engages into the recess, of the other housing part is likewise semi-annular or, owing to electrical contacts being routed through, only approximately semi-annular and likewise runs around the outside of half of the interior of the module housing or virtually half, and a layer section of the adhesive layer, which layer section lies between the inner wall of the recess and the engaging protrusion, forms a semi-annular sealing ring which seals off the interior of the module housing in a semi-annular manner or approximately semi-annular manner.

The adhesive layer preferably fully embeds electrical contacts of the module, which are routed to the outside between the two housing parts which are adhesively bonded to one another, in the region between the two housing parts which are adhesively bonded to one another.

The recess is preferably groove-like and therefore preferably forms a groove, in particular a groove with a square, rectangular, triangular, polygonal or round, in particular semicircular or semioval, cross section.

With a view to two-stage or multiple-stage radial meandering for slowing down the flow of escaping explosive gas, it is considered to be advantageous when the two housing parts have at least two annular connecting regions which run around the interior of the module housing in an annular manner and are each formed by a recess in one of the two housing parts and a protrusion of complementary shape in the respectively other housing part, and the protrusion and the inner wall of the recess are each adhesively bonded by the adhesive layer in the annular connecting regions.

In the case of the last-mentioned embodiment, it is advantageous, in particular, when one of the two annular connecting regions forms an internal annular connecting region and each of the other annular connecting regions surrounds at least the inner annular connecting region radially on the outside. The annular connecting regions, as seen from inside radially to the outside, form a two-stage or multiple-stage adhesively bonded meandering structure.

In respect of the housing parts which are to be sealed off, it is considered to be advantageous when one of the two housing parts forms a cooling panel which carries the electrical component, and the other of the two housing parts is an annular frame element. As an alternative, both housing parts can each form annular frame elements. The cooling panels are preferably composed of a conductive material, for example metal; the annular frame elements are preferably composed of a non-conductive or poorly conductive material and preferably form an insulator.

With a view to use in converters, in particular converters for high-voltage systems, it is considered to be advantageous when the module housing contains a lower cooling panel which carries a lower electrical component, preferably a semiconductor switching element, in particular a semiconductor switching element which has a transistor, a lower annular frame element which lies on the lower cooling panel, and a central annular frame element which lies on the lower frame element. At least two contact rails for making contact with the lower electrical component are routed out of the module housing between the lower and the central annular frame element, in particular at opposite points. An upper annular frame element is provided and lies on the central annular frame element. At least two contact rails for making contact with an upper electrical component, preferably a semiconductor switching element, in particular a semiconductor switching element which has a transistor, are routed out of the module housing between the central and the upper annular frame element, in particular at opposite points. An upper cooling panel rests on the upper annular frame element and carries the upper electrical component.

The housing parts described above is adhesively bonded by at least one adhesive layer and sealed off by the adhesive layer preferably form two of said module housing parts which lie directly one on the other. All of the housing parts are particularly preferably adhesively bonded to one another.

The housing parts or the module housing parts can additionally be connected to one another in another way, for example can be screwed together, or can additionally be held together, in particular pressed one onto the other, by an external clamping apparatus.

The module preferably forms a converter module for use in energy transmission technology.

The invention also relates to a converter, in particular for use in energy transmission technology and in particular for multilevel converters, containing a large number of electrical modules.

In respect of a converter of this kind, the invention provides that at least one of the modules, preferably all of the modules, are modules as described above. In respect of the advantages of the converter according to the invention, reference may be made to the above statements.

Other features which are considered as characteristic for the invention are set forth in the appended claims.

Although the invention is illustrated and described herein as embodied in an electrical module containing an electrical component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

In the figures, the same reference symbols are always used for identical or comparable components for reasons of clarity.

Figure 1:
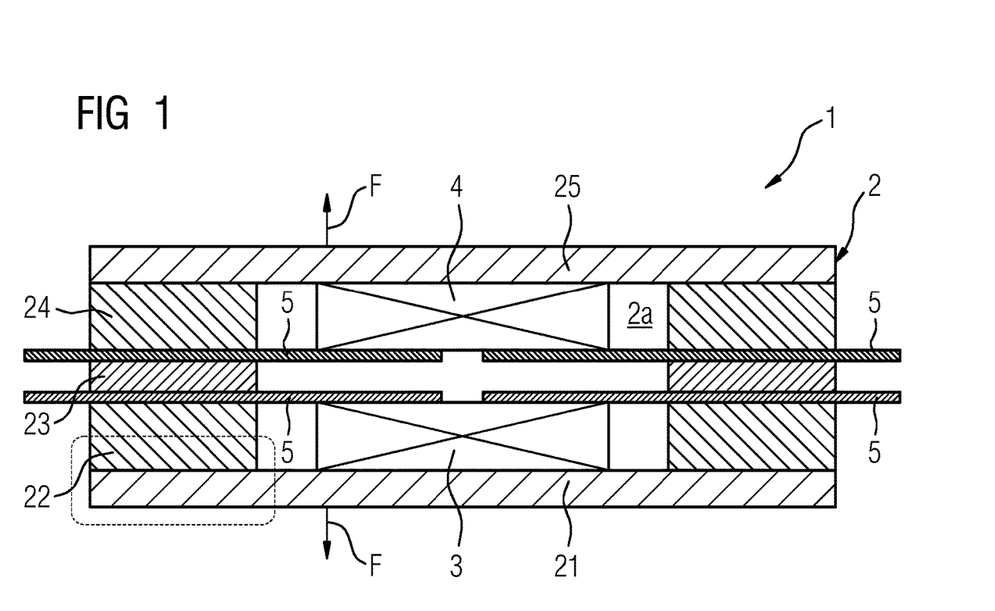
FIG. 1 is a diagrammatic, sectional view an exemplary embodiment of an electrical module without sealing elements shows for a general explanation of the invention according to the invention.

Referring now to the figures of the drawings in detail and first, particularly to FIG. 1 thereof, there is shown an electrical module 1 which containing a module housing 2 which is closed to the outside. A semiconductor switching element 3, which is at the bottom in FIG. 1, and a semiconductor switching element 4, which is at the top in FIG. 1, are located within the module housing 2. The semiconductor switching elements 3 and 4 are, for example, bipolar transistors with an insulated gate electrode. Contact rails 5, which are routed out of the module housing 2 at the sides, are provided for making contact with the two semiconductor switching elements 3 and 4.

For the purpose of cooling the lower semiconductor switching element 3, the module housing 2 containing a cooling panel 21 which is at the bottom in FIG. 1, an annular frame element 22, which is at the bottom in FIG. 1, lying on the cooling panel. A central annular frame element 23 is located on the lower annular frame element 22, an annular frame element 24, which is at the top in FIG. 1, in turn lying on the central annular frame element. The module housing 2 is closed off at the top by an upper cooling panel 25 which lies on the upper annular frame element 24 and serves to cool the semiconductor switching element 4. The contact rails 5 are routed out between the central annular frame element 23 and the lower annular frame element 22 and, respectively, between the central annular frame element 23 and the upper annular frame element 24 at the sides.

Screws or an external clamping apparatus, which are/is not further shown in FIG. 1 for reasons of clarity, preferably serve to hold together the sandwich structure which is formed by the housing parts of the module housing 2. For example, a plurality of electrical modules 1 can also lie one on the other by way of their cooling panels (in a manner electrically insulated from one another); in the case of an embodiment of this kind, the clamping apparatus preferably holds the stack of sandwich structures together.

In the event of an electrical fault or in the event of an explosion in the interior 2a of the module housing 2, a very high gas pressure can be produced, the gas pressure pushing the module housing parts to the outside; the force effect due to the internal pressure in the interior 2a is identified in FIG. 1 by arrows with the reference symbol F.

Figure 2:
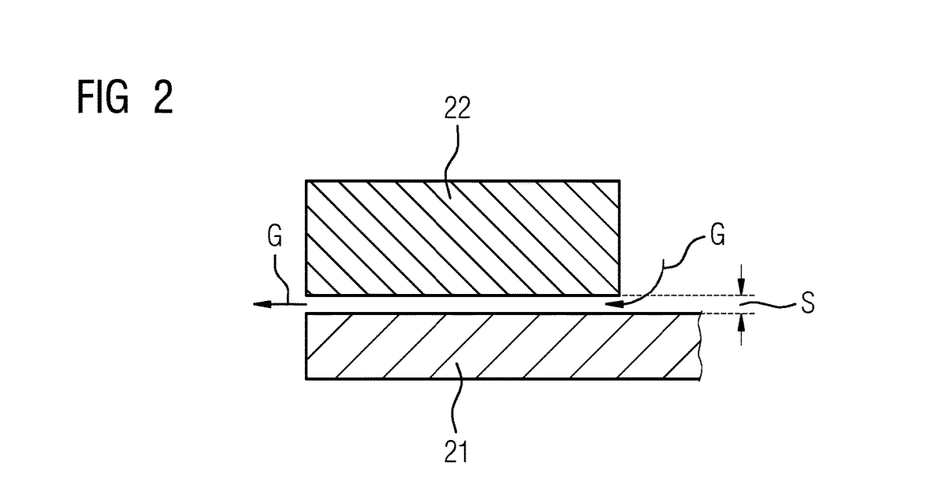
FIG. 2 is an enlarged sectional view of a detail of the module according to FIG. 1 in the event of an explosion in an interior of a module housing.

FIG. 2 shows an enlarged illustration of a detail of the section of the module housing 2 which is marked by dashed lines in FIG. 1 when, in the event of an explosion in the interior 2a of the module housing 2, the lower cooling panel 21 is pushed away from the lower annular frame element 22—in spite of the opposing holding force of the screws or clamping apparatus. It can be seen that a gap S is produced between the two module housing parts 21 and 22, it being possible for a gas flow G to escape from the interior 2a through the gap. The escape of hot gas to the outside in this way is undesirable since the gas could likewise destroy or affect other electrical modules which are arranged in the immediate vicinity.

In order to avoid the problem of an undesired gas flow G to the outside in the event of an explosion in the interior 2a, adhesive layers are provided in the exemplary embodiments described below, the adhesive layers holding together the housing parts which are adhesively bonded to one another and allowing the interior 2a of the module housing 2 to be sealed off. The adhesive layers can be used in addition to the screws already mentioned or the external clamping apparatus already mentioned or as an alternative thereto.

Figure 3:
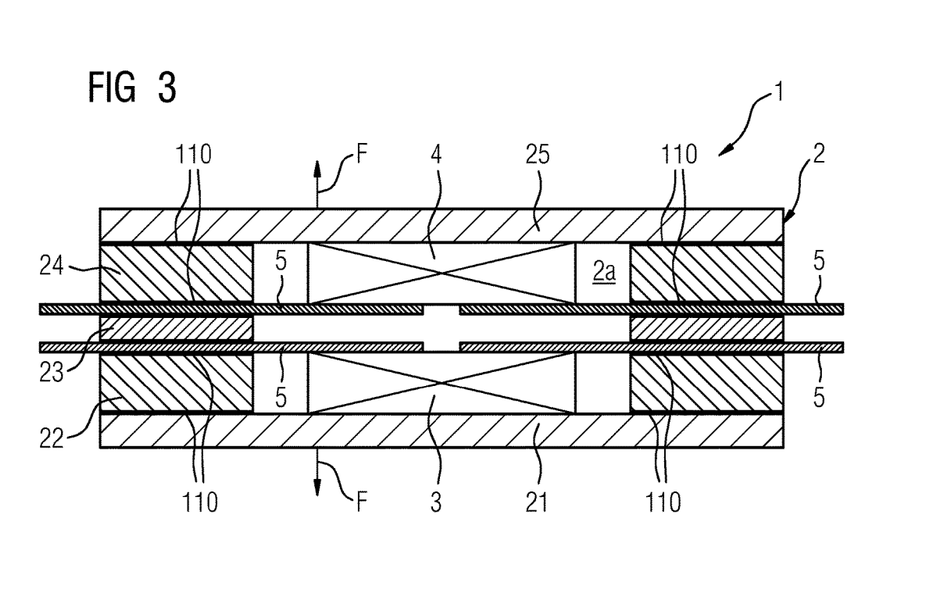
FIGS. 3-4 are sectional views of an exemplary embodiment of an electrical module with planar adhesive layers.

FIG. 3 shows an exemplary embodiment of the electrical module 1 which—substantially—corresponds to the design of the electrical module 1 according to FIG. 1. For example, the electrical module 1 according to FIG. 3 also has a lower cooling panel 21, three annular frame elements 22, 23 and 24 and also an upper cooling panel 25, which panels and elements close off the module housing 2 to the outside and define an interior 2a in which two semiconductor switching elements 3 and 4 are accommodated.

In order to avoid the problem described in conjunction with FIG. 2 of an undesired gas flow G through a gap S between the lower annular frame element 22 and the lower cooling panel 21 in the event of an explosion, planar adhesive layers 110 are provided in the electrical module 1 according to FIG. 3, the adhesive layers running around the interior 2a of the module housing 2 in an annular manner.

Figure 4:
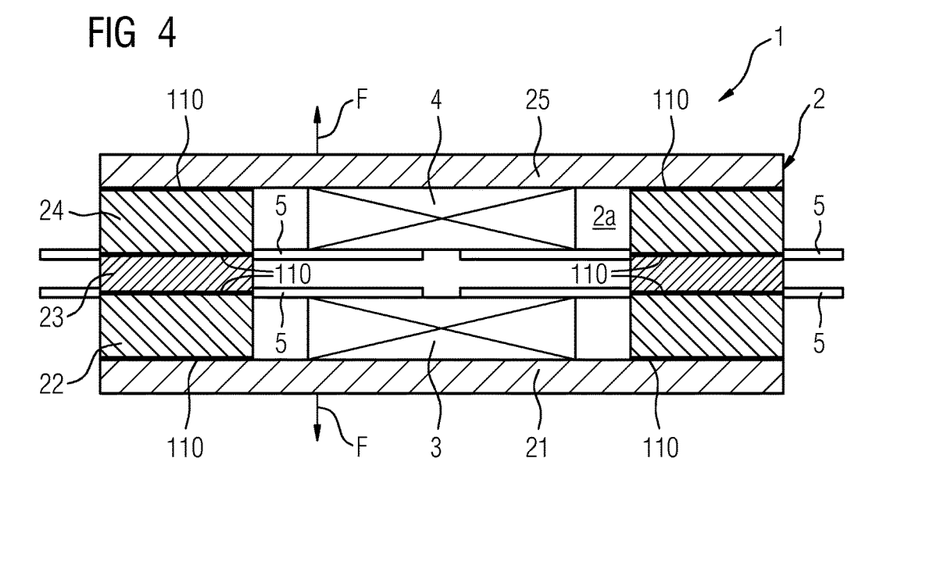

FIG. 4 shows the electrical module 1 and its module housing 2 according to FIG. 3 in a different cross section, specifically in a cross section outside the region of the contact rails 5. It can be seen that the three annular frame elements 22, 23 and 24 lie directly one on the other and are adhesively bonded to one another by adhesive layers 110 outside the region of the contact rails 5.

Figure 5:
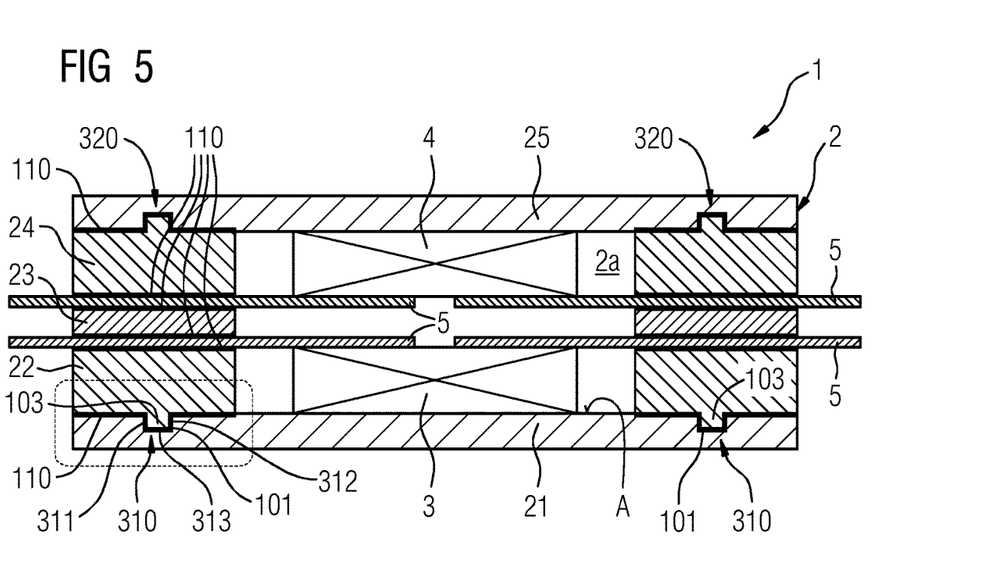
FIGS. 5-9 are illustrations showing an exemplary embodiment of an electrical module with non-planar adhesive layers and a single-stage meandering structure.

FIG. 5 shows a further exemplary embodiment of an electrical module 1, in which adhesive layers 110 are provided for sealing off module housing parts.

In order to adhesively bond or seal off the cooling panel 21, which is at the bottom in FIG. 5, and the lower annular frame element 22 which is situated above the cooling panel, the adhesive layer 110 has, in the exemplary embodiment according to FIG. 5, a layer section 310 which has a u-shaped cross section and runs around the interior 2a of the module housing 2 in an annular manner. The layer section 310 contains two side walls 311 and 312 which are connected by a base wall 313. Each of the two side walls 311 and 312 are at an angle to the support surface A or to the support plane in which the two housing parts 21 and 22 lie one on the other. The base wall 313 of the layer section 310 is preferably parallel to the support plane or support surface A.

The layer section 310 of u-shaped cross section is situated in an annularly encircling recess 101 in the lower cooling panel 21. A protrusion 103 of the lower annular frame element 22 engages into the inner groove which is defined by the two side walls 311 and 312 of the layer section 310; the protrusion 103 extends at an angle or perpendicular to the support plane A or to the support surface between the two housing parts 21 and 22.

Figure 6:
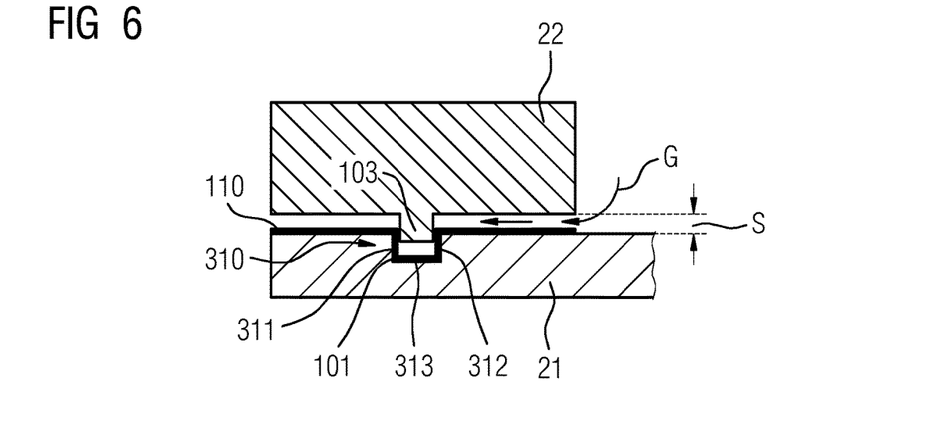

Engagement of the projection 103 into the u-shaped layer section 310 results in a kind of meandering or formation of meanders in the region of the interface or support surface between the housing parts 21 and 22, it being necessary for a gas flow G to be deflected several times by the meandering in the event of the adhesive connection breaking and a gap forming between the housing parts after an explosion, before the gas flow can reach the outside; this is shown in greater detail in FIG. 6. It can be seen that, in the event of formation of a gap S, a gas flow G cannot reach the outside parallel to the support surface A or parallel to the support plane, but rather is initially deflected a total of four times by the projection 103 and the groove-like recess 101 before it can reach the outside. This therefore results in an extension of the gas path and, in association with this, a significant reduction in pressure and temperature of the residual gas flow which nevertheless occurs in spite of the layer section 310 where possible.

Furthermore, it can be seen in FIG. 6 that the gas flow G is also stopped or at least slowed down by the u-shaped layer section 310 which remains between the recess 101 and the projection 103 even when the adhesive connection as such has been destroyed by the gas pressure.

FIG. 5 furthermore shows a further u-shaped layer section 320 which adhesively bonds the upper annular frame element 24 and the upper cooling panel 25 and seals off these two housing parts in the same way as has already been described in conjunction with the layer section 310.

Figure 7:
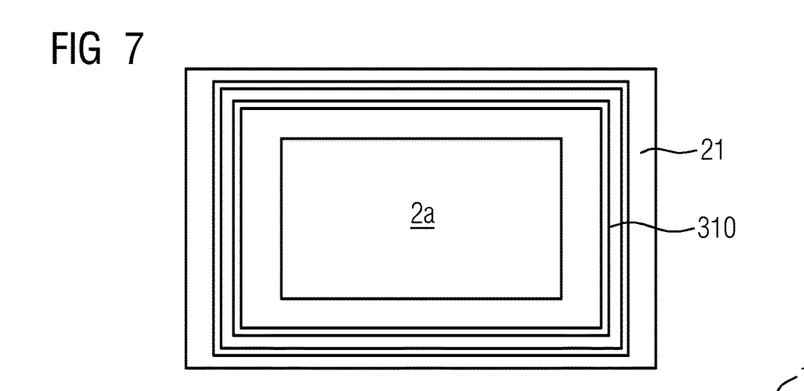

FIG. 7 shows a plan view of the layer section 310 according to FIG. 5. It can be seen that the layer section 310 runs around the interior 2a in an annular manner.

Figure 8:
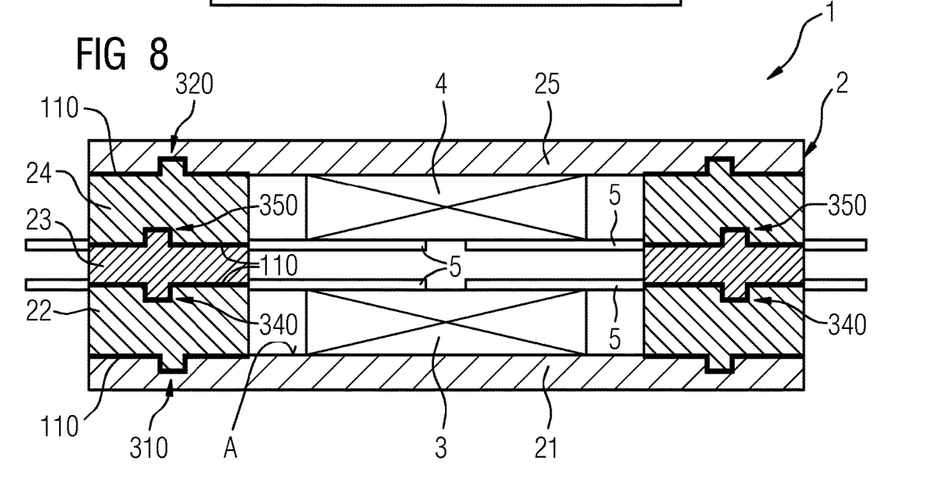

FIG. 8 shows the electrical module 1 according to FIGS. 5 to 7 in a different cross section, specifically in a region outside the contact rails 5. It can be seen that the annular frame elements 22 and 23 which lie directly one on the other are additionally sealed off by a semi-annular layer section 340 of the adhesive layer 110, the layer section being of u-shaped cross section, in the region outside the contact rails 5. The layer section 340 of the adhesive layer 110 adhesively bonds a recess in the lower annular frame element 22 to a corresponding projection of the annular frame element 23 which is located above it.

Figure 9:
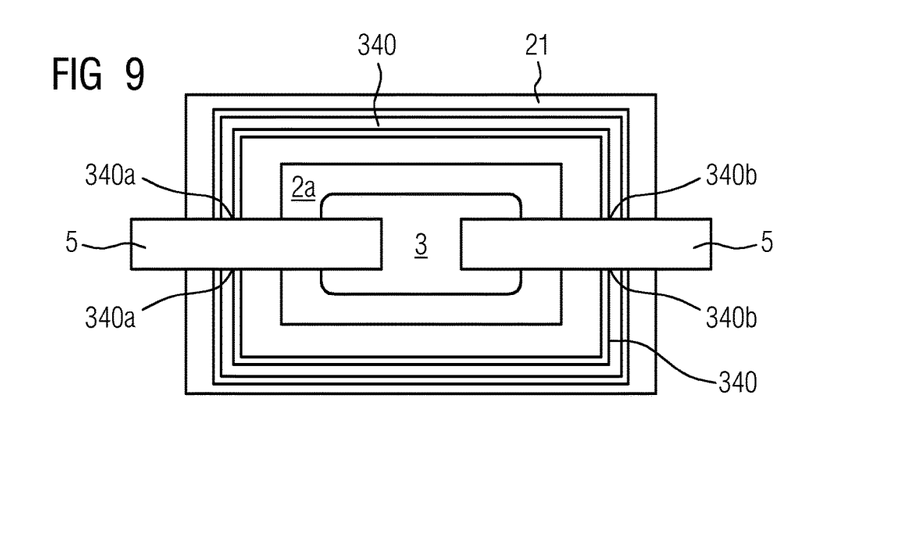

The semi-annular layer sections 340 which are provided for sealing off the two frame elements 22 and 23 are shown in a more detailed plan view in FIG. 9. It can be seen that the section ends 340a and 340b of the layer sections 340 are situated opposite one another in respective pairs and are separated from one another by the contact rails 5 with which contact is made with the lower semiconductor switching element 3.

FIG. 8 furthermore shows a further semi-annular layer section 350 which is of u-shaped cross section and is suitable for adhesively bonding and for sealing off the central annular frame element 23 and the upper annular frame element 24 which is located above it. The layer sections 350 can be identical to the layer sections 340, and therefore reference may be made to the above statements in this respect.

Figure 10:
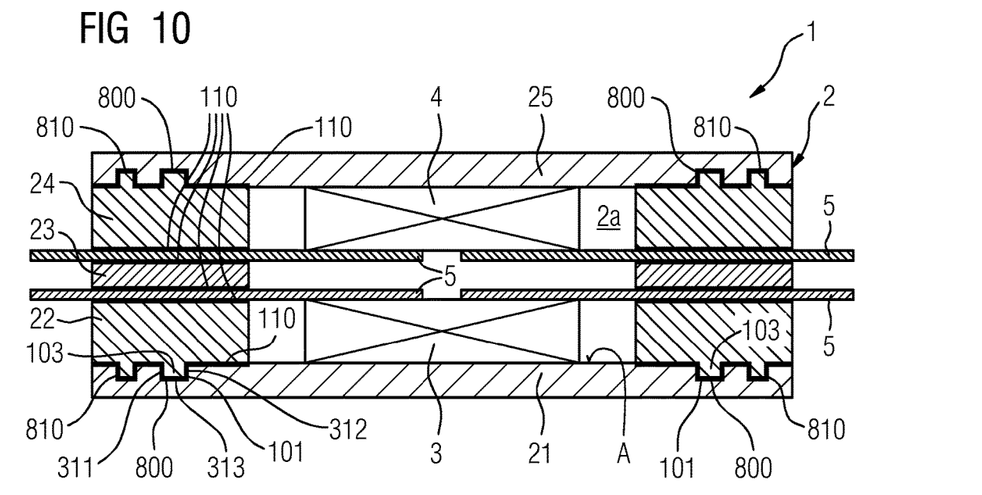
FIGS. 10-11 are illustrations showing an exemplary embodiment of an electrical module with non-planar adhesive layers and a multiple-stage meandering structure.

FIG. 10 shows an exemplary embodiment of an electrical module 1 in which housing parts which are connected to one another in each case have two or more annular connecting regions which each run around the interior 2a of the module housing 2 in an annular or semi-annular manner and are each formed by a recess in a housing part and a projection in the respectively other housing part. The projection and the inner wall of the recess are respectively adhesively bonded in the annular connecting regions.

For reasons of clarity, only two annular or semi-annular connecting regions are shown per housing part interface and identified by reference symbols 800 and 810 in FIG. 10; however—as mentioned—each of the housing part interfaces can also have more than two annular or semi-annular connecting regions.

Figure 11:
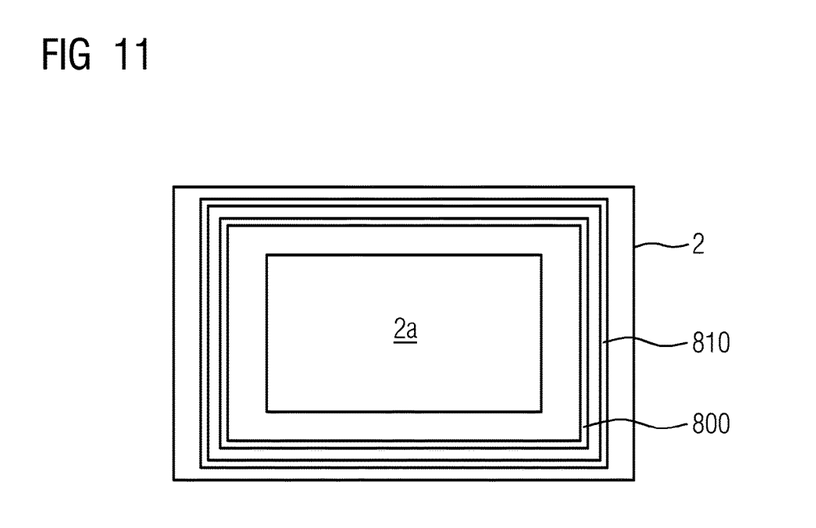

The annular connecting regions 800 and 810 are preferably arranged coaxially or, as seen in plan view, concentrically. Each of the annular connecting regions—with the exception of the outermost connecting region 810—therefore in each case forms an internal annular connecting region for the respectively next outer connecting region here. This is shown in plan view in FIG. 11.

Owing to the arrangement of the connecting regions 800 and 810, the connecting regions, as viewed from inside radially to the outside, form a multiple or multiple-stage meandering structure for a gas stream flowing to the outside (see FIG. 6 which shows a single or single-stage meandering structure).

As has been explained in conjunction with the exemplary embodiments according to FIGS. 3 to 10, planar adhesive layers 110 as shown in FIGS. 3 and 4 and/or non-planar adhesive layers, for example with layer sections 310 or 320 of u-shaped cross section as shown in FIGS. 5 to 10, can thus be provided for adhesively bonding and sealing off the two cooling panels 21 and 25 with the annular frame elements 22 and, respectively, 24 bearing against them. In addition to the adhesive connections, mechanical elements such as screw elements (for example screws, bolts with threads, etc.) or other clamping elements can also be used to hold together the housing parts of the electrical module 1.

The exemplary embodiments explained in conjunction with FIGS. 1 to 11 can have one, several or all of the following advantages, depending on the specific refinement.

The adhesive layers ensure absorption of force over a large surface area and in a uniform manner and prevent sagging of housing parts in the event of an explosion.

Cable or contact bushings can be sealed off during application of the adhesive layers by additional adhesive with a low level of expenditure. The production process is simplified in comparison to conventional production methods.

Although the invention has been illustrated and described in greater detail by preferred exemplary embodiments, the invention is not restricted by the disclosed examples and other variations can be derived therefrom by a person skilled in the art without departing from the scope of protection of the invention.

The following is a summary list of reference numerals and the corresponding structure used in the above description of the invention:

1 Module
2 Module housing
2a Interior
3 Lower semiconductor switching element
4 Upper semiconductor switching element
5 Contact rails
21 Lower cooling panel
22 Lower annular frame element
23 Central annular frame element
24 Upper annular frame element
25 Upper cooling panel
101 Recess
103 Protrusion
110 Adhesive layer
310 u-shaped layer section
311 Side wall
312 Side wall
313 Base wall
320 u-shaped layer section
340 u-shaped layer section
350 u-shaped layer section
340a Layer section end
340b Layer section end
800 Connecting region
810 Connecting region
A Support surface/support plane
F Arrows
G Gas flow
P Gas pressure
S Gap

The invention claimed is:

1. An electrical module, comprising:
    a module housing having at least two housing parts lying one on another and, on their own or together with at least one further housing part of said module housing, delimit an interior of said module housing;
    at least one electrical component accommodated in said module housing;
    at least one adhesive layer between said two housing parts, said adhesive layer adhesively bonding said two housing parts to one another;
    at least one of said two housing parts having at least one recess formed therein, said recess having an inner wall being covered by said adhesive layer;
    an other of said two housing parts having a protrusion engaging into said recess, said protrusion and said recess being adhesively bonded to one another by said adhesive layer;
    said recess is semi-annular or, owing to electrical contacts which are routed to an outside, only approximately semi-annular and said recess runs around the outside of half of said interior of said module housing;
    said protrusion, engaging into said recess, of said other housing part is likewise semi-annular or, owing to said electrical contacts being routed through, only approximately semi-annular and likewise runs around the outside of half of said interior of said module housing; and
    said adhesive layer having a layer section which lies between said inner wall of said recess and said protrusion, forming a semi-annular sealing ring which seals off said interior of said module housing in a semi-annular manner.

2. The module according to claim 1, wherein said adhesive layer forms a laminated ring which runs around said interior of said module housing in an annular manner.

3. The module according to claim 1, wherein:
said layer section, in cross section, is u-shaped or is u-shaped at least in sections and has two side walls and a base wall which connects said two side walls;
each of said two side walls in each case forms an adhesive section which is disposed at an angle to a support plane in which said two housing parts lie one on the other; and
said base wall of said layer section lies on a base of said recess, said base is parallel to the support plane.

4. The module according to claim 3, wherein said base is parallel to the support plane in one of said two housing parts.

5. The module according to claim 3, wherein said recess is a groove-shaped recess having a groove base and said base is parallel to the support plane on said groove base.

6. The module according to claim 1, wherein:
said recess is annular and runs around an outside of said interior of said module housing in an annular manner;
said protrusion, which engages into said recess, of said other housing part likewise runs around the outside of said interior of said module housing in the annular manner and engages as an annular protrusion into said recess being an annular recess; and
said layer section which lies between said inner wall of said recess and said protrusion, forms an annular sealing ring which seals off said interior of said module housing in an annular manner.

7. The module according to claim 1, further comprising electrical contacts and wherein said adhesive layer fully embeds said electrical contacts which are routed to the outside between said two housing parts which are adhesively bonded to one another, in a region between said two housing parts which are adhesively bonded to one another.

8. The module according to claim 1, wherein said recess is groove-shaped and forms a groove.

9. The module according to claim 1, wherein:
one of said housing parts forms a cooling panel which carries said electrical component, and the other of said two housing parts is an annular frame element; or
both of said housing parts are each annular frame elements.

10. The module according to claim 1, wherein:
said two housing parts have at least two annular connecting regions which run around said interior of said module housing in an annular manner and are each formed by said recess in one of said two housing parts and a protrusion of complementary shape in said other housing part; and
said protrusion and said inner wall of said recess are each adhesively bonded by means of said adhesive layer in said annular connecting regions.

11. The module according to claim 10, wherein:
one of said two annular connecting regions forms an internal annular connecting region;
each of said other annular connecting regions surrounds at least said internal annular connecting region radially on an outside; and
said annular connecting regions, as seen from inside radially to the outside, form a two-stage or multiple-stage adhesively bonded meandering structure.

12. The module according to claim 1, wherein the module is a converter module for use in energy transmission technology.

13. An electrical module, comprising:
a module housing having at least two housing parts lying one on another and, on their own or together with at least one further housing part of said module housing, delimit an interior of said module housing;
at least one electrical component accommodated in said module housing;
at least one adhesive layer disposed between said two housing parts, said adhesive layer adhesively bonding said two housing parts to one another;
said at least one electrical component including a lower electrical component and an upper electrical component;
said at least two housing parts of said module housing further including:
a lower cooling panel carrying said lower electrical component;
a lower annular frame element lying on said lower cooling panel;
a central annular frame element lying on said lower frame element,
at least two contact rails for making contact with said lower electrical component are routed out of said module housing between said lower and said central annular frame element;
an upper annular frame element lying on said central annular frame element;
at least two further contact rails making contact with said upper electrical component are routed out of said module housing between said central and said upper annular frame element; and
an upper cooling panel resting on said upper annular frame element and carries said upper electrical component.

14. The module according to claim 13, wherein said lower electrical component and said upper electrical component are semiconductor switching elements having a transistor.

15. A converter, comprising:
a plurality of electrical modules, at least one of said electrical modules containing:
a module housing having at least two housing parts lying one on another and together delimit an interior of said module housing;
at least one electrical component accommodated in said module housing;
at least one adhesive layer between said two housing parts, said adhesive layer adhesively bonding said two housing parts to one another;
at least one of said two housing parts having at least one recess formed therein, said recess having an inner wall being covered by said adhesive layer;
an other of said two housing parts having a protrusion engaging into said recess, said protrusion and said recess being adhesively bonded to one another by said adhesive layer;
said recess is semi-annular or, owing to electrical contacts which are routed to an outside, only approximately semi-annular and said recess runs around the outside of half of said interior of said module housing;
said protrusion, engaging into said recess, of said other housing part is likewise semi-annular or, owing to said electrical contacts being routed through, only approximately semi-annular and likewise runs around the outside of half of said interior of said module housing; and said adhesive layer having a layer section which lies between said inner wall of said recess and said protrusion, forming a semi-annular sealing ring which seals off said interior of said module housing in a semi-annular manner.

16. The converter according to claim 15, wherein the converter is a multilevel converter.

\* \* \* \* \*